(12) United States Patent
Viala et al.

(10) Patent No.: US 8,610,428 B2
(45) Date of Patent: Dec. 17, 2013

(54) VARIABLE-RESPONSE MAGNETIC RADIOFREQUENCY DEVICE

(75) Inventors: Bernard Viala, Sassenage (FR); Smaali Rafik, Clermont-Ferrand (FR); Patrick Queffelec, Brest (FR); Evangeline Benevent, Marseilles (FR); Jean-Philippe Michel, Corenc (FR)

(73) Assignees: Commissariat a l'Energie Atomique et aux Energies Alternatives, Paris (FR); Centre National de la Recherche, Paris (FR); Universite Brest-Bretagne Occidentale, Brest Cedex (FR)

( * ) Notice: Subject to any disclaimer, the term of this patent is extended or adjusted under 35 U.S.C. 154(b) by 456 days.

(21) Appl. No.: 12/946,199

(22) Filed: Nov. 15, 2010

(65) Prior Publication Data
US 2011/0116194 A1 May 19, 2011

(30) Foreign Application Priority Data

Nov. 17, 2009 (FR) ...................................... 09 58090

(51) Int. Cl.
*G01R 33/02* (2006.01)
(52) U.S. Cl.
USPC ............................. 324/244; 324/200; 324/246
(58) Field of Classification Search
None
See application file for complete search history.

(56) References Cited

U.S. PATENT DOCUMENTS

2007/0285843 A1* 12/2007 Tran ............................ 360/245.9
2008/0068759 A1  3/2008 Orlando et al.

FOREIGN PATENT DOCUMENTS

| FR | 2905793 | 9/2006 |
|---|---|---|
| JP | 8-288143 | 11/1996 |
| JP | 1-40427 | 2/1999 |
| JP | 2000-296612 | 10/2000 |
| WO | 2005/064783 A2 | 7/2005 |

OTHER PUBLICATIONS

Salahun et al. "Application of Ferromagnetic Composite in Different Planar Tunable Microwave Devices" *Microwave and Optical Technology Letters*, 30(4): 272-276 (Aug. 20, 2001).
Acikel, et al. "A New High Performance Phase Shifter Using $Ba_xSr_{1-x}TiO_3$ Thin Films" *IEEE Microwave and Wireless Components Letters*, 12(7): 237-239 (Jul. 2002).
Flaviis et al. "Planar Microwave Integrated Phase-Shifter Design with High Purity Ferroelectric Material" *IEEE Transactions on Microwave Theory and Techniques*, 45(6): 963-969 (Jun. 1997).
Arai et al. "A New Hybrid Device using Magnetostrictive Amorphous Films and Piezoelectric Substrates" *IEEE Transactions on Magnetics*, 60(2): 916-918 (Mar. 1994).

* cited by examiner

*Primary Examiner* — Jermele M Hollington
*Assistant Examiner* — Trung Nguyen
(74) *Attorney, Agent, or Firm* — Occhiuti & Rohlicek LLP

(57) ABSTRACT

This variable-response magnetic radiofrequency device integrated into a substrate comprises:
- a beam that is mobile relative to the substrate having, at each end, a transversal part mechanically anchored to the substrate and at least one central arm connecting the transversal parts to each other, at least one of the transversal parts being made out of a piezoelectric material,
- actuating electrodes associated with the piezoelectric material to apply a stress on the central arm,
- a magnetic element directly deposited on the central arm whose permeability varies as a function of the stress, and
- a conductive strip comprising a central part fixed to an upper face of the magnetic element opposite the lower face of this magnetic element pointed towards the central arm.

11 Claims, 4 Drawing Sheets

VARIABLE-RESPONSE MAGNETIC RADIOFREQUENCY DEVICE

CROSS-REFERENCE TO RELATED APPLICATIONS

Under 35 USC 119, this application claims the benefit of the Nov. 17, 2009 priority date of French Application No. 0958090, the content of which are hereby incorporated by reference in their entirety.

BACKGROUND OF THE INVENTION

The invention pertains to a variable-response magnetic radiofrequency device integrated into a substrate.

The term "radiofrequency" herein designates usual frequencies ranging from 1 MHz to 5 GHz.

These devices are made using the same collective manufacturing methods as those used to make micro-electronic chips. For example, these devices are made out of monocrystalline silicon or glass wafers on which are deposited metallic and dielectrical materials, structured by lithography and etching.

The devices in question here are continually variable devices known as "analog" devices as opposed to devices variable by discrete switching and known as "digital" devices. Continuous variation is provided by the continuous variation of the magnetic permeability of a magnetic element.

PRIOR ART

Variable-response magnetic radiofrequency devices have many applications. They can be used to modify a characteristic of an electrical signal that crosses the device as a function of the permeability of the magnetic element. Such a device may also be called "a device to modify a characteristic of an electrical signal". For example, they may be used as variable inductors, phase-shifters, impendence tuners, phase delay lines.

Such known devices include:

a beam that is mobile relative to the substrate having, at each end, a transversal part mechanically anchored to the substrate and at least one central arm connecting the transversal parts to each other, at least one of the transversal parts being made out of a piezoelectric material, actuating electrodes associated with the piezoelectric material to apply a stress on the central arm, a magnetic element directly deposited on the central arm whose permeability varies as a function of the stress, a conductive strip placed on only one side of the beam and electromagnetically coupled with the magnetic element.

The conductive strip vehicles the electrical signal, characteristic of which is to be modified.

The patent application FR 2 905 793 discloses a device of this kind. In particular, the application FR 2 905 793 describes a variable inductor having a high inductance value (i.e. above 1 nH) and low resistivity (i.e. below 1 ohm).

The use of a central arm enables a stress to be applied to the magnetic element along the longitudinal axis of this arm with almost no application of stress transversally to this axis. This appreciably improves the working of the device.

In the patent application FR 2 905 793, the conductive strip is mechanically independent of the magnetic element. To this end, there is a spacing been the conductive strip and the magnetic element provided by means of a cavity that is empty or filled with a soft material. More specifically, the conductive strip is either coiled about the magnetic element or placed solely beneath the magnetic element and the central arm.

The manufacture of the conductive strip coiled about the magnetic element is complicated.

When the conductive strip is placed solely beneath the central arm, the variations in inductance are limited.

Finally these devices are devoid of impedance-matching means.

SUMMARY OF THE INVENTION

The invention is therefore aimed at resolving at least one of these problems.

An object of the invention therefore is a variable-response magnetic radiofrequency device in which the conductive strip comprises a central part fixed to an upper face of the magnetic element opposite the lower face of this magnetic element pointed towards the central arm.

In the above device, the fact of fixedly joining the central part of the conductive strip to the magnetic element may increase its stiffness and tend to limit the variations of its permeability. However, this is largely compensated for by the improvement of the electromagnetic coupling between the strip and the magnetic element. This improvement is caused by the proximity of the central part of the strip with the magnetic element. Indeed, the central arm is no longer interposed between the magnetic element and the conductive strip.

Furthermore, the fact of depositing the central part of the conductive strip on the magnetic element simplifies the manufacture of the device. It is no longer necessary to deposit and then eliminate a sacrificial layer to make the conductive strip mechanically independent of the magnetic element.

Thus, the above device increases the amplitude of the variations in inductance and is at the same time easy to make.

The embodiments of this device may include one or more of the following characteristics:

the magnetic element is a uniaxial magnetic material for which the axis of easier magnetization is parallel to the direction in which the central part of the conductive strip chiefly extends;

the central arm extends along a longitudinal axis and the central part of the conductive strip extends perpendicularly to this longitudinal axis;

the central arm extends along a longitudinal axis and the central part of the conductive strip extends parallel to this longitudinal axis;

the device also comprises ground elements extending in parallel to the conductive strip to enable to propagation of a radiofrequency signal between the conductive strip and the ground elements;

the conductive strip also comprises two ends on either side of its central part fixed without any degree of freedom to the substrate and the ground elements comprise two coplanar ground strips, coplanar with these ends and electrically insulated from these ends by slots whose dimensions are chosen to match the impedance of these ends with a predetermined value;

the conductive strip also has two ends on either side of its central part fixed without any degree of freedom to the substrate and spaced out from the ground elements by a predetermined distance to match the impedance of these ends with a predetermined value and the ground elements also comprise a ground plane placed beneath the central arm and spaced out from the central part of the conductive strip by a height h chosen to keep the impedance between the central part and the ground plane equal to the predetermined value ±50%;

the central part of the conductive strip is directly deposited on the upper face of the magnetic element;

the device comprises an electrically insulating layer directly deposited on the upper face of the magnetic element and the central part of the conductive strip is directly deposited on this insulating layer;

the electrically insulating layer has a thickness of less than 1 μm;

the central part of the conductive strip is shaped as a meander formed by several strands parallel to the axis of easier magnetization of the magnetic element and juxtaposed beside one another so that the mutual inductance between each pair of strands immediately next to each other is negative.

These embodiments furthermore have the following advantages:

aligning the direction of easier magnetization of the magnetic element with the direction in which the central part of the strip extends increases the range in which the variations of inductance are linear;

placing the central arm and the central part of the conductive strip perpendicularly to each other prevents the conductive strip from hampering the implantation of the actuating electrodes, placing the central part of the conductive strip in parallel to the central arm limits the mechanical stresses applied to the conductive strip on the magnetic element;

the presence of ground elements extending in parallel to the conductive strip enables the propagation of the radiofrequency signal through the device and the adjustment of the impedance;

placing the central part of the conductive strip directly to the upper face of the magnetic element increases the amplitude of the variation of the signal in response to a variation in the stress, the presence of an electrically insulating layer between the central part of the conductive strip and the magnetic element, which is itself conductive, enables the use of a low-resistance conductive strip made of a material whose conductivity is not sufficient for it to be directly deposited on the magnetic element without increasing the skin effect in this element (reducing the permeability at high frequency);

the meader shape of the central part of the conductive strip maximizes the range of variation of the inductance of the device.

BRIEF DESCRIPTION OF THE DRAWINGS

The invention will be understood more clearly from the following description given purely by way of a non-restrictive example and made with reference to the appended drawings, of which.

In these figures, the same references are used to designate the same elements.

DETAILED DESCRIPTION OF THE INVENTION

Here below in this description, the characteristics and functions well known to those skilled in the art are not described in detail.

Figure 1:
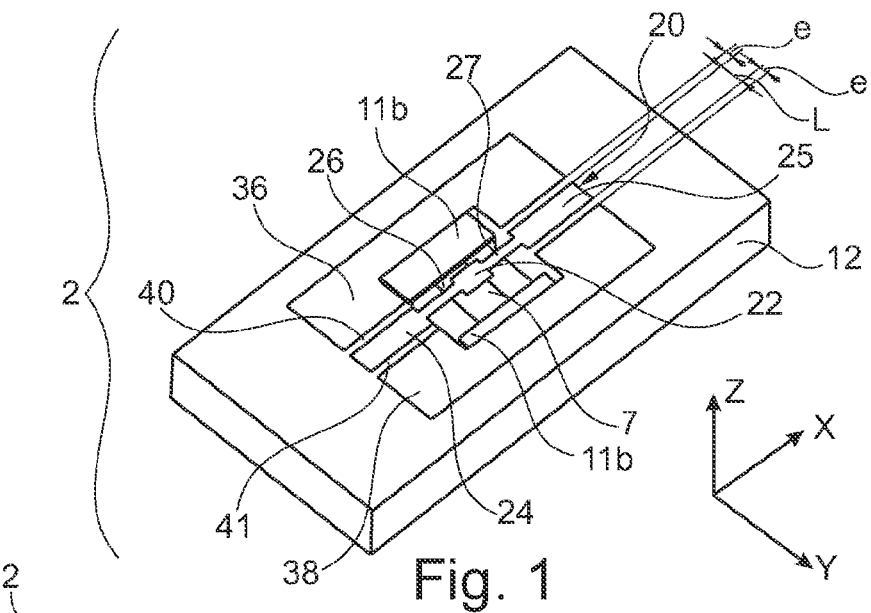
FIG. 1 is a schematic illustration in perspective of a variable response magnetic radiofrequency device.
Figure 2:
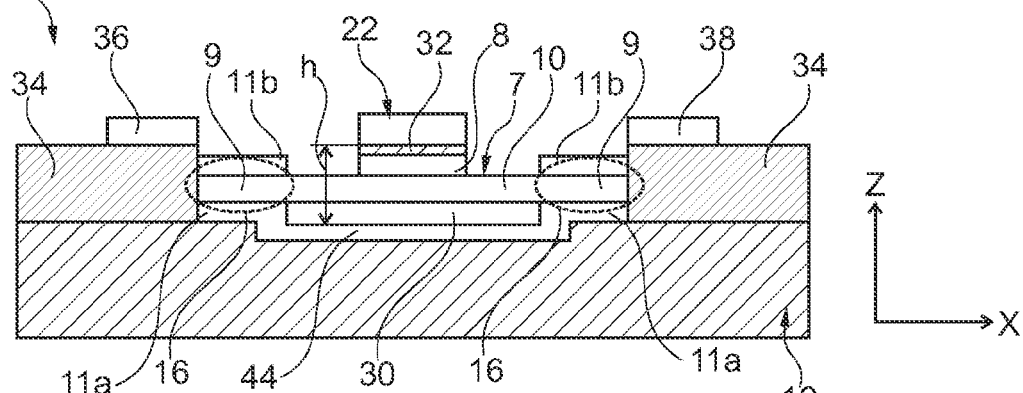
FIG. 2 is a schematic illustration in cross-section of the device of FIG. 1.
Figure 3:
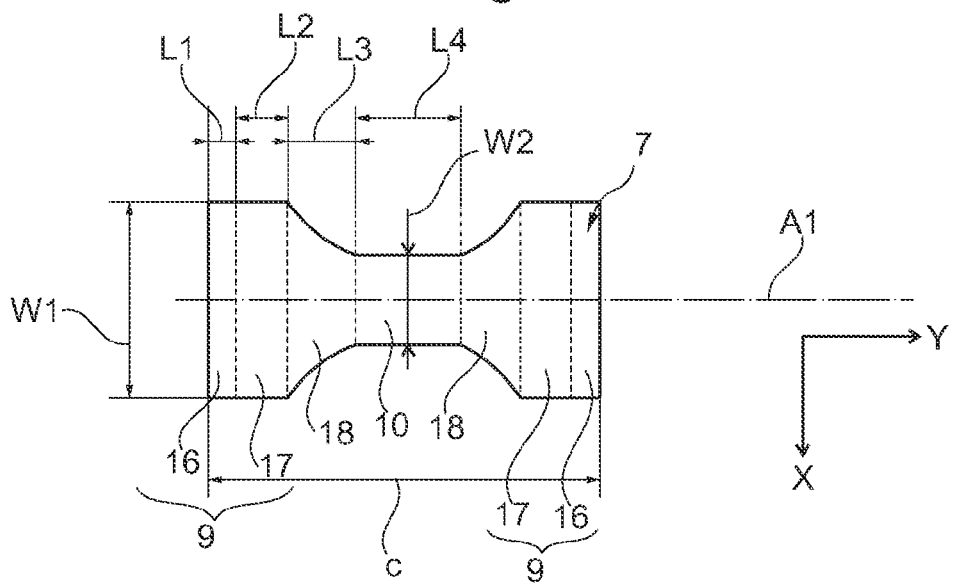
FIG. 3 is a schematic illustration in a top view of a beam of the device of FIG. 1.

FIGS. 1 to 3 represent a variable-response magnetic radiofrequency device 2 on a substrate 12. In FIG. 1, the device 2 extends essentially in a horizontal plane referenced by orthogonal directions X and Y. The vertical direction is referenced by a direction Z.

The device 2 has a beam 7 made of piezoelectric material designed to generate mechanical stresses in a magnetic element 8 (FIG. 2).

The beam 7 has the shape of a tension test specimen and, along a longitudinal reference axis A1 (FIG. 3) parallel to the direction Y, it has two transversal parts 9 with a width W1 and a central arm 10 with a width W2. Preferably, the width W2 is smaller than the width W1. Advantageously, the width W2 is at least twice as small as the width W1.

The beam 7 is anchored in the substrate 12 on which the device 2 is formed. More specifically, the beam 7 is anchored to the substrate 12 at the mechanical anchoring zones 16 situated at the ends of the transversal parts 9. The beam 7 is thus free in its movement relative to the substrate 12 outside these anchoring zones 16 to enable maximum amplitude of deformation of the central arm 10.

The anchoring zone 16, having a length L1 and a width W1 (FIG. 3), define the end of the transversal zones 9 opposite the central arm 10. These anchoring zones provide for a strong mechanical link, without any degree of freedom, with the substrate 12.

The arm 10 has a length L4 in the direction Y. This central arm 10 corresponds to the zone of the beam 7 in direct contact with the lower face of the magnetic element 8.

The profile of the beam 7 is chosen and optimized to generate uniaxial and homogenous stresses in the magnetic element 8. The term "uniaxial stresses" refers to the fact that the stresses are exerted essentially and almost uniquely in the direction Y whereas no stress or almost no stress whatsoever is exerted in the central arm along the direction X. For example, the stresses exerted in the direction Y are 10 or 100 times greater than the stresses exerted in the direction X.

To this end, the transversal parts 9 essentially have a zone 17 with a length L2 and a width W1 which generates the essential part of the stresses in the central arm 10.

Each transversal part 9 is extended by an optional transition zone 18 having a length L3 and a variable width. The transition zone 18 extends from the zone 17 up to the arm 10. For example, the transition zone 18 has an elliptical profile advantageously tangential to the zone 17 and the arm 10.

The transition zones 18 with an elliptical profile can be used especially to concentrate and distribute the stresses homogenously while providing for maximum compactness of the device 2.

A beam 7 such as this, embedded solely at its ends (anchoring zone 16), can be used especially to apply greater stresses and to control these stresses more efficiently.

The device 2 has a lower actuating electrode 11a and an upper actuating electrode 11b (FIG. 2) placed on either side of the beam 7. These electrodes 11a and 11b cooperate with the beam 7 to generate the actuating voltage necessary for applying the mechanical stresses in the magnetic element 8. Depending on the voltage applied between the electrodes 11a and 11b, namely positive or negative voltage, compression stresses or tensile stresses are generated in the magnetic element 8. Here, the electrodes 11a are connected to ground.

The electrodes 11a and 11b extend on the major part of the surface of the transversal parts 9, respectively above and below these transversal parts. However, preferably, the electrodes 11a and 11b do not extend to the level of the transition zones 18.

The magnetic element 8 is directly deposited on the arm 10 of the beam 7. It is therefore fixed without any degree of freedom to this arm 10 and is in direct contact with it. In particular, no conductive strip or conductive electrode is interposed between the magnetic element 8 and the arm 10.

The magnetic element 8 is made out of a magnetic material having permeability that varies as a function of the stresses applied to it. Preferably, the magnetic material used is uniaxial. For example, it is formed by an alloy based on iron and/or cobalt and/or nickel. The magnetic element 8 can be deposited under a magnetic field to encourage the anisotropy of the material. Here, the magnetic material has a direction of easier magnetization appreciably parallel or perpendicular to the longitudinal axis A1. More specifically, in this embodiment, the direction of easier magnetization is perpendicular to the axis A1.

By way of an illustration, the magnetic element 8 is a parallelepiped whose greatest faces are horizontal. The width of the magnetic element in the direction X ranges for example from 100 μm to 500 μm. The length of the magnetic element in the direction Y for example also ranges between 100 μm and 500 μm.

The device 2 also has a conductive strip 20 (FIG. 1) which extends mainly in parallel to the direction of easier magnetization of the magnetic element 8. In this example, the conductive strip 20 therefore extends perpendicularly to the axis A1 in a plane situated above the magnetic element 8. This strip 20 conveys the electrical signal that crosses the device 2.

This strip 20 comprises:

a central part 22 mechanically fixed without any degree of freedom to the magnetic element 8, and two ends 24, 25 situated on either side of the central part 22 and fixed to the substrate 12 without any degree of freedom.

The ends 24 and 25 are mechanically and electrically connected to the central part 22 by means of bridges 26, 27 suspended above a cavity 30. The cavity 30 is the same as the one which mechanically isolates the arm 10 of the substrate 12.

The central part 22 is deposited on the magnetic element 8. More specifically, here, the central part 22 is directly deposited on a layer 32 of electrical insulator which is itself directly deposited on an upper face of the magnetic element 8. This layer 32 is optional, especially for low frequencies (i.e. for frequencies below 100 MHz typically). The thickness of this layer 32 in the direction Z is less than 1 μm and preferably less than 0.1 μm so as to minimize the distance between the central part 22 and the magnetic element 8.

The ends 24 and 25 are either directly deposited on the substrate 12 or directly deposited, as shown here, on a layer 34 made of an electrically insulating material itself directly deposited on the substrate 12. This layer 34 is designed to bring the ends 24, 25, the central part 22 and the ground elements which shall be described here below into the same plane.

The central part 22 and the ends 24 and 25 have a width L (FIG. 1) which is constant in the direction Y. The bridges 26 and 27 for their part have a width L' strictly smaller than the width L so as not to bind the central part 22 too rigidly to the ends 24 and 25 of the conductive strip.

For example, the width L ranges from 10 μm to 100 μm. The total length of the conductive strip 20 between these two ends ranges from 750 μm to 1150 μm.

The strip 20 is made out of a conductive material of low stiffness so as not to excessively limit the deformations of the magnetic element 8. For example, the material chosen has a Young's modulus of less than 100 GPa. Furthermore, to limit the stiffness of the conductive strip, its thickness is chosen to be smaller than 1 μm and preferably smaller than 0.5 μm. The material of the conductive strip is typically a metal such as gold, silver or aluminum.

The device 2 also includes ground elements which extend in parallel to the strip 20 so that radiofrequency waves can be proparaged through this device with matched impedance. To this end, the device 2 comprises two ground strips 36 and 38 which extend along the strip 20 in the same plane as this strip. These strips 36 and 38 are fixed without any degree of freedom to the substrate 12. To this end, the strips 36 and 38 are herein directly deposited on the insulating layer 34. These strips 36 and 38 are shaped so as to match the impedance of the fixed parts of the strip 20, i.e. the ends 24 and 25. To this end, the strips 36 and 38 are electrically insulated from the ends 24 and 25 by slots 40, 41 with a constant thickness e. The thickness e and the width L of the ends 24, 25 are chosen so as to match the impedance of the fixed paths of the strip 20 with a predetermined value such as 50 Ohms. To this end, the thickness e ranges for example from 10 μm to 100 μm.

The ground elements also comprise a lower ground plane 44 with a function of matching the impedance of the central part 22 of the strip 7. This ground plane is situated beneath the central part 22 and more specifically beneath the arm 10. The ground plane 44 is herein deposited at the bottom of the cavity 30. The ground plane 40 is at a distance from a lower face of the center part 22 equal to a constant height h (FIG. 2). This height h is chosen so as to match the impedance of the central part 22 with the same value as that chosen for the ends 24 and 25. This value therefore is herein equal to 50 Ohms. However, given that the permeability of the magnetic element 8 is designed to vary, the matching of the impedance of the central part 22 consists in keeping the impedance of this central part 22 at around 50 Ohms. For example, the matching is done in such a way that the impedance of the central part 22, during the working of the device 2, is systematically equal to 50 Ohms±50%. In the example described here, the height h is chosen so that the impedance of the central part ranges from 30 to 70 Ohms whatever the variation in permeability of the magnetic element 8. For example, the height h ranges from 5 to 50 μm.

Here, the ground plane 44 extends beneath the zones 17 of the transversal parts 9 so as to also form the actuating electrodes 11a.

During the working of the device 2, a difference in voltage is applied to the actuating electrodes 11a and 11b, thus putting the magnetic element 8 under stress. The magnetic element 8 gets elastically deformed, causing its permeability to vary. This variation in permeability modifies at least one characteristic of the electrical signal that goes through the device 2 along the strip 20. In particular, the variation in the permeability in the magnetic element 8 affects the equations of propagation of the electrical signal.

This embodiment of the radiofrequency device has several advantages:

the strip 20 does not hamper the implementation of the actuating electrodes 11b, the combination in a single block of matter in the ground plane 44 and of the actuating electrodes 11a enables this set of elements to be grounded by means of a single connection pad, the small distance between the central part 22 and the magnetic element 8 increases the electromagnetic coupling between these two elements and therefore the variation of the signal in response to a variation in stress exerted on the magnetic element 8.

It has been noted by measurement, for example, that the variation in inductance is improved by 50% to 100% as compared with the device described with reference to FIG. 5 in the patent application FR 2 905 793.

Figure 4:
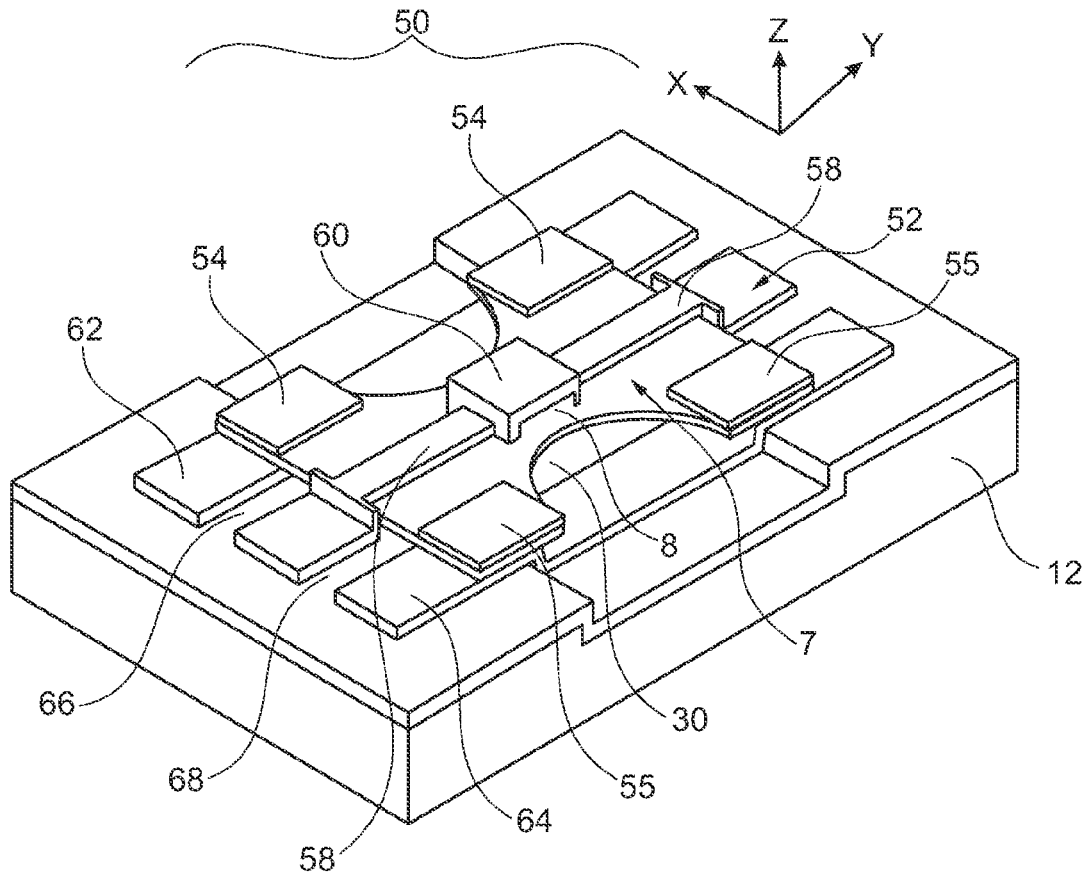
FIG. 4 is a schematic illustration in perspective of another embodiment of a variable response magnetic radiofrequency device.

FIG. 4 shows a device 50 similar to the device 2 except that the strip 20 is replaced by a conductive strip 52 which extends in parallel to the longitudinal axis of the beam 7. Consequently, the strip 52 extends on the transversal paths 9 of the beam 7. For example, the strip 52 has two ends 58 directly deposited on the transversal paths 9 and one central part 60 directly deposited on the arm 20 and the magnetic element 8. In this example, the insulating layer 32 is omitted. Indeed, this insulating layer 32 can be omitted if the resistivity of the strip 52 is far smaller than that of the magnetic element 8. For example, the resistivity of the strip 52 is less than 1000 $\mu\Omega/cm$.

The magnetic element 8 is turned so that its direction of easier magnetization remains parallel to the direction in which the strip 52 extends.

The actuating electrodes 11b are also replaced by actuating electrodes 54 and 55 positioned on each side of the ends of the conductive strip 52. These electrodes 54 and 55 are placed so as to be facing lower actuation electrodes 11a.

The lower ground plane 44 and the ground strips 36, 38 are replaced by two ground strips 62, 64 which extend in parallel to the direction Y.

The remote ends of these strips 62 and 64 are positioned beneath the beam 7 substantially vertical to the actuation electrodes 54 and 55. Thus, these ends form the actuation electrodes 11a. Then, the ground strips 62 and 64 are extended to the bottom of the cavity 30.

These strips 62 and 64 enable the impedance of the device 50 to be matched. To this end, the far ends of the strips 62 and 64 are kept at a distance from the ends of the strip 52 by slots 66, 68 whose thickness e is chosen to match the impedance of the device 50 with a predetermined value such as 50 Ohms.

The height between the bottom of the cavity 30 and the strip 52 is chosen to be smaller than 1 $\mu m$. Thus, as an initial approximation, the strips 62 and 64 may be considered to be coplanar with the strip 52 throughout their length. Thus, the impedance of the device 50 is adjusted solely by playing on the thickness e of the slots 66, 68 and the width L of the strip 52.

Figure 5:
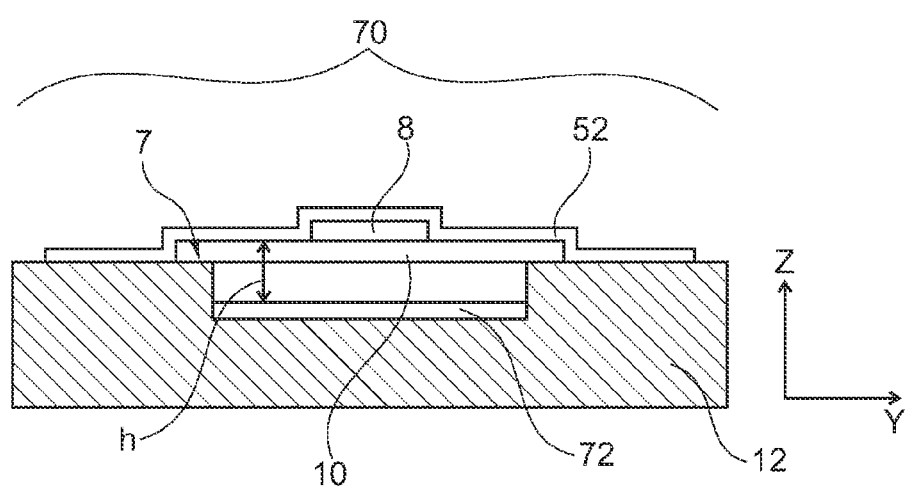
FIG. 5 is a schematic illustration in vertical section of another embodiment of the device of FIG. 4.

FIG. 5 represents a device 70 identical to the device 50 except that the ground strips 62 and 64 are electrically connected to one another by a ground plane 72 situated beneath the arm 10 of the beam 7. In this case, the impedance of the central part 50 of the strip 52 is adjusted by playing on the height h between this central part and the ground plane 72. This height h typically ranges from 5 $\mu m$ to 50 $\mu m$. The fact that the height h varies slightly when the strip 52 goes above the magnetic element 8 can be overlooked because the thickness of the magnetic element 8 is small. For example, the thickness of the magnetic element ranges from 0.2 to 0.5 $\mu m$.

Figure 7:
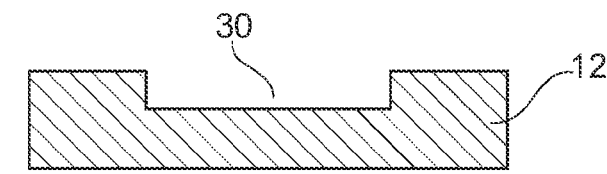
Figure 6:
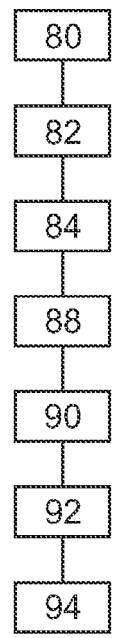
FIG. 6 is a flowchart of a method for manufacturing the device of FIG. 5, FIGS. 7 to 13 are schematic illustrations in vertical section of different steps of the method of FIG. 6, and FIGS. 14 and 15 are schematic illustrations and a top view of particular embodiments of a conductive strip of a variable-response magnetic radiofrequency device.

FIG. 6 shows a flowchart of a method for manufacturing the device 70. FIGS. 7 to 13 give a more detailed view of the different steps of this method of manufacture. Initially, at a step 80, the substrate 12 is etched to create the cavity 30 (FIG. 7).

Figure 8:
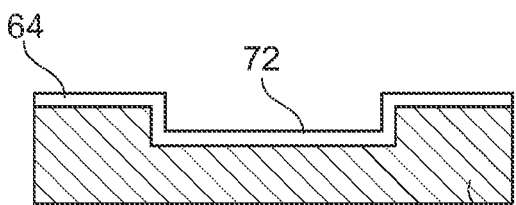
Figure 9:
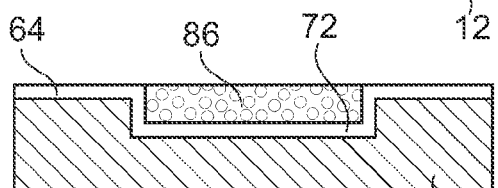

Then, at a step 82, the ground plane 72 and the ends of these strips 62 and 64 forming the lower actuating electrodes 11a are deposited (FIG. 8).

At a step 84, the cavity 30 is filled with a sacrificial material 86 (FIG. 9), an organic resin or a mineral layer such as silica or metal. This material 86 is to be removed for example by means of a solvent or by a fluoridation method in the case of a mineral layer.

Figure 10:
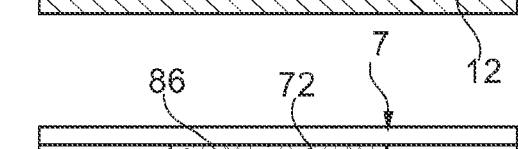

Then, at a step 88, the beam 7 made of piezoelectric material is deposited (FIG. 10). The beam 7 extends over the lower actuating electrodes 11a as well as over the material 86.

Figure 11:
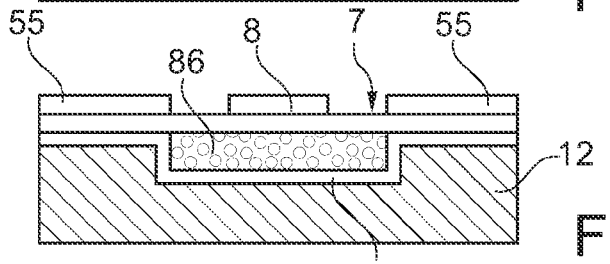

Then, at a step 90, the upper actuating electrode 54 and 55 as well as the magnetic element 8 are directly deposited on the beam 7 (FIG. 11). At the step 90, the upper actuating electrodes 54 and 55 are structured so as to leave a place for depositing the conductive strip 52.

Figure 12:
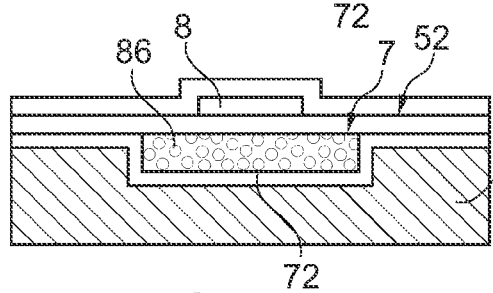

At the step 92, the conductive strip 92 is deposited directly on the beam 7 and the magnetic element 8 (FIG. 12).

Figure 13:
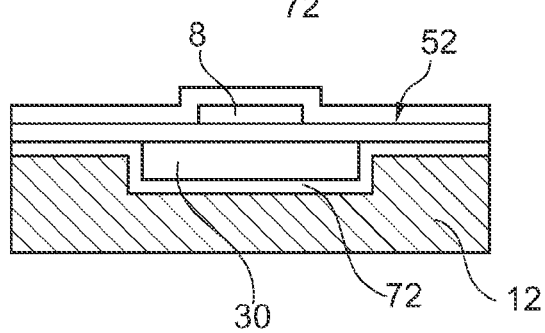

Finally, at a step 94, the material 86 is eliminated so as to create the cavity 30 (FIG. 13).

Figure 14:
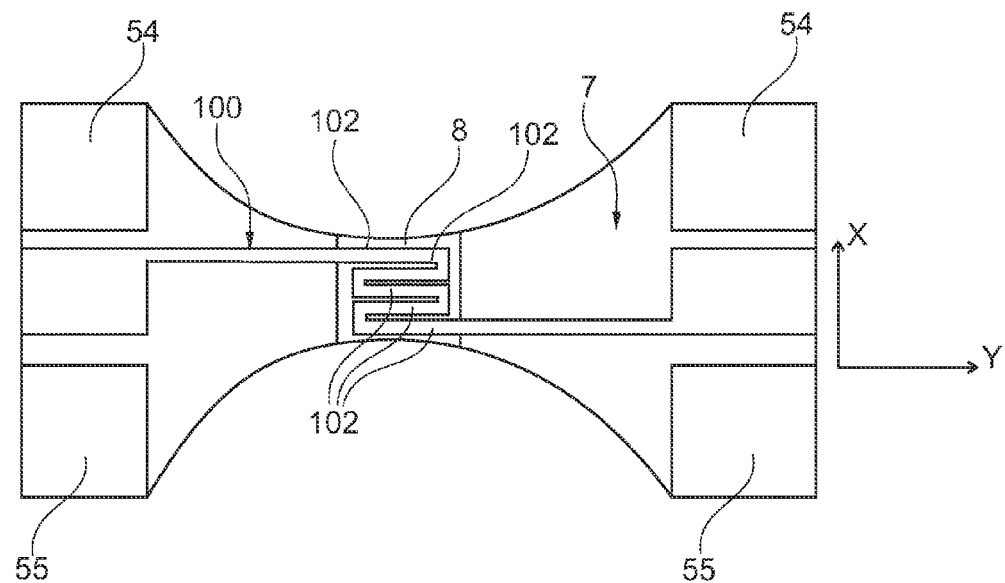

FIG. 14 represents a conductive strip 100 that can be used instead of any one of the conductive strips described here above. This strip 100 is identical for example to the conductive strip 52 except that, in its central part, it is shaped as a meander. More specifically, in the central part directly deposited above the magnetic element 8, the strip 100 has several strands 102 juxtaposed with one another and extending in parallel to one another. These strands 102 are juxtaposed beside one another in the direction X and all extend in parallel to the direction Y, i.e. in parallel to the direction of easier magnetization of the magnetic element 8. These strands are electrically connected to one another so that the mutual inductance between two consecutive strands is negative. This particular shaping of the central part of the conductive strip increases the range of variance of the inductance of the device. For example, it is estimated that the amplitude of the range of variation of the inductance is at least twice as much when the conductive strip is shaped in a meander than it is when the conductive strip is purely rectilinear.

Figure 15:
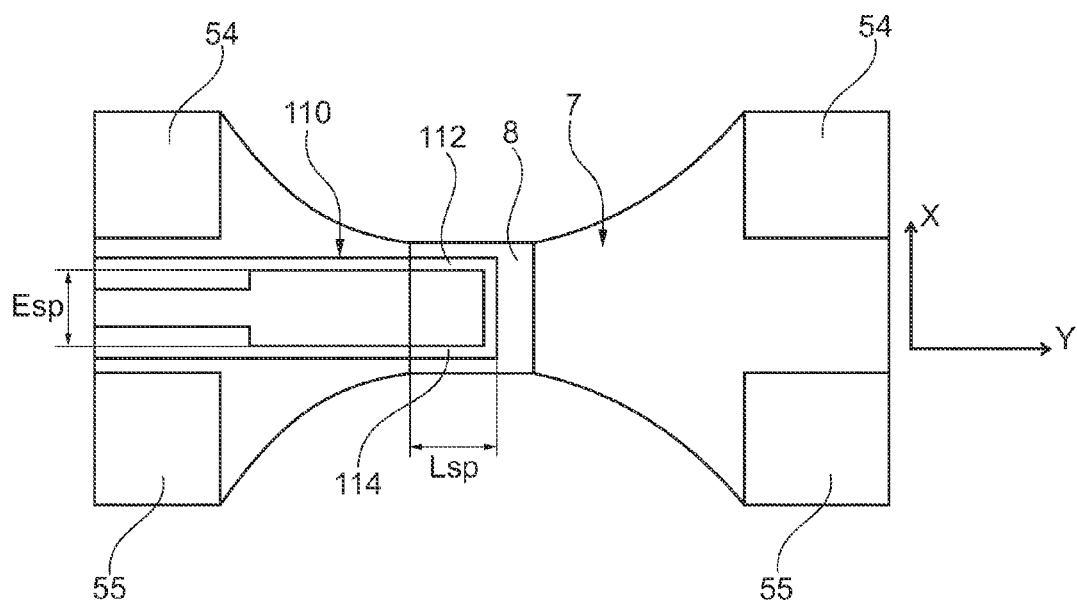

FIG. 15 represents a conductive strip 110 identical to the strip 100 except that the meander comprises an even number of strands. Here, the meander is formed solely by two strands 112 and 114. The length Lsp of each strand ranges for example from 300 $\mu m$ to 500 $\mu m$. The width of the strands 112 and 114 ranges from 5 $\mu m$ to 30 $\mu m$. Finally, the spacing Esp between the two strands ranges from 50 $\mu m$ to 150 $\mu m$. Thus, the use of a meander shape above the magnetic element 8 doubles the amplitude of the range of variation of the inductance. An even number of strands makes it possible to have both ends of the conductive strip 110 on the same side of the beam 7, thus simplifying the connections.

Many other embodiments are possible. For example, the impedance matching means made by means of the different ground elements can be omitted if the device 2 is used only as a variable inductor. In this case, the ground strips and the ground planes are omitted.

As a variant, the widths L, L' and L" respectively of the ends 24, 25, the bridges 26, 27 and the central part 22 are different. For example, when the device 2 is used as a variable inductor, preferably the width L is greater than the width L' and the width L' is far greater than the width L". For example, the width L' is at least twice or three times greater than the width L" of the central part 22. For example, the central part 22 has a width L" in the direction Y, equal to 1 $\mu m$ to 10 $\mu m$ in order to maximize its contribution in the overall inductance and the ends 24 and 25 have a width L typically around 100 $\mu m$ to facilitate the connections.

The impedance of the above devices can be matched with a value other than the value of 50 Ohms For example, what has just been described can be applied to any desired characteristic impedance value such as for example 600 Ohms Most of the variants described in the patent application FR 2 905 793 can also be applied here. For example, only one of the transversal parts 9 can be equipped with actuating electrodes. In this case, the other transversal part is used essentially as an anchoring point for the beam 7 on the substrate.

Profiles other than those shown are possible for the transition zone 18. For example, the different profiles shown in the patent application FR 2 905 793 can be used.

Holes can be made through the zones 17 and 18 of the beam 7 to facilitate the release of the sacrificial material during the step 94.

The magnetic element 8 can have different shapes. Examples of shapes are given in the patent application FR 2 905 793. In particular, the magnetic element 8 can be formed by several distinct magnetic blocks. For example, in the embodiment of FIG. 14, the magnetic element 8 is replaced by a magnetic element formed by five distinct magnetic blocks each positioned respectively beneath the strands 102. The space between these magnetic blocks can then be filled for example by a non-magnetic material, i.e. one that has no measurable magnetization when there is no external magnetic field. Each of these magnetic blocks is oblong and extends in parallel to the strand beneath which it is placed. This conformation of the magnetic element facilitates the control of the mutual inductance between the strands.

In the embodiments of FIGS. 14 and 15, the device must have at least two strands and may include three, four or more than five strands to form the meander.

The device can also comprise several central arms parallel to one another as described in the patent application FR 2 905 793.

The cavity beneath the central arm can be filled with material that is soft enough to enable the deformation of the magnetic element 8.

The central arm as well as the transition zone of the beam 7 can be made out of a material other than a piezoelectric material. For example the central arm can be made out of a material harder than the piezoelectric material used to form the transversal parts.

The device described here can be used to make a variable inductor, a phase-shifter, an impedance tuner or a phase delay line.

The invention claimed is:

1. A variable-response magnetic radiofrequency device integrated into a substrate, said variable-response magnetic radiofrequency device comprising: a beam that is mobile relative to the substrate, said beam having, at each end thereof, a transversal part mechanically anchored to the substrate, and at least one central arm connecting the transversal parts to each other, at least one of the transversal parts being made out of a piezoelectric material, actuating electrodes associated with the piezoelectric material to apply a stress on the central arm, a magnetic element directly deposited on the central arm, the magnetic element having a permeability that varies as a function of the stress, and a conductive strip placed on only one side of the beam, said conductive strip being electromagnetically coupled to the magnetic element, wherein the conductive strip comprises a central part fixed to an upper face of the magnetic element opposite a lower face of the magnetic element, said strip being pointed towards the central arm.

2. The device of claim 1, wherein the magnetic element is a uniaxial magnetic material for which an axis of easier magnetization is parallel to a direction in which the central part of the conductive strip chiefly extends.

3. The device of claim 2, wherein the central part of the conductive strip is shaped as a meander formed by several strands parallel to the axis of easier magnetization of the magnetic element and juxtaposed beside one another so that the mutual inductance between each pair of adjacent strands is negative.

4. The device of claim 1, wherein the central arm extends along a longitudinal axis and the central part of the conductive strip extends perpendicularly to said longitudinal axis.

5. The device of claim 1, wherein the central arm extends along a longitudinal axis and the central part of the conductive strip extends along a direction parallel to said longitudinal axis.

6. The device of claim 1, wherein the device further comprises ground elements extending in a direction parallel to the conductive strip to enable propagation of a radiofrequency signal between the conductive strip and the ground elements.

7. The device of claim 6, wherein the conductive strip further comprises two ends on either side of said central part, said two ends being fixed without any degree of freedom to the substrate, and wherein the ground elements comprise two ground strips extending in parallel with said ends and being electrically insulated from said ends by slots whose dimensions are chosen to match an impedance of said ends with a predetermined value.

8. The device of claim 6, wherein the conductive strip also has two ends on either side of said central part thereof, said two ends being fixed without any degree of freedom to the substrate and spaced from the ground elements by a predetermined distance to match the impedance of said ends with a predetermined value, and wherein the ground elements further comprise a ground plane placed beneath the central arm and spaced from the central part of the conductive strip by a height h chosen to keep the impedance between the central part and the ground plane equal to the predetermined value ±50%.

9. The device of claim 1, wherein the central part of the conductive strip is directly deposited on the upper face of the magnetic element.

10. The device of claim 1, wherein the device comprises an electrically insulating layer directly deposited on the upper face of the magnetic element, and wherein the central part of the conductive strip is directly deposited on said insulating layer.

11. The device of claim 10, wherein the electrically insulating layer has a thickness of less than 1 μm.

\* \* \* \* \*